(12) United States Patent
Jaszcar et al.

(10) Patent No.: US 10,115,574 B2
(45) Date of Patent: Oct. 30, 2018

(54) HERMETICALLY SEALED MAGNETIC KEEPER CATHODE

(71) Applicant: KURT J. LESKER COMPANY, Jefferson Hills, PA (US)

(72) Inventors: Matthew Jaszcar, Bethel Park, PA (US); Robert M. Belan, South Park, PA (US); Roger Patterson, Finleyville, PA (US)

(73) Assignee: Kurt J. Lesker Company, Jefferson Hills, PA (US)

( * ) Notice: Subject to any disclaimer, the term of this patent is extended or adjusted under 35 U.S.C. 154(b) by 242 days.

(21) Appl. No.: 15/137,278

(22) Filed: Apr. 25, 2016

(65) Prior Publication Data
US 2016/0358763 A1    Dec. 8, 2016

Related U.S. Application Data

(60) Provisional application No. 62/172,302, filed on Jun. 8, 2015.

(51) Int. Cl.
*H01J 37/34* (2006.01)
*H01J 37/32* (2006.01)

(52) U.S. Cl.
CPC .... *H01J 37/3497* (2013.01); *H01J 37/32513* (2013.01); *H01J 37/345* (2013.01); *H01J 37/3435* (2013.01)

(58) Field of Classification Search
CPC ............... H01J 37/3435; H01J 37/3452; H01J 37/3417; H01J 37/3497; H01J 37/32513; H01J 37/345

USPC ........................................ 204/298.09, 298.19
See application file for complete search history.

(56) References Cited

U.S. PATENT DOCUMENTS

| | | | |
|---|---|---|---|
| 5,286,361 A | 2/1994 | Makowiecki et al. | |
| 5,333,726 A | 8/1994 | Makowiecki et al. | |
| 5,597,459 A * | 1/1997 | Altshuler ............ | H01J 37/3408 204/192.12 |

* cited by examiner

*Primary Examiner* — Rodney G McDonald
(74) *Attorney, Agent, or Firm* — The Webb Law Firm

(57) ABSTRACT

A sputtering cathode includes a magnet array having an outer, ring magnet surrounding an inner, disk magnet. A sputtering target is positioned on one side of the magnet array covering a side of the ring magnet and a side of the disk magnet, and a magnetic keeper disk is positioned between the sputtering target and the disk magnet. A cooling well positioned between the ring magnet and the disk magnet is in contact with part of the sputtering target. One or more cooling tubes is/are coupled to the cooling well. An outer body flange surrounds the one or more cooling tubes and contacts a side of the ring magnet opposite the sputtering target. An inner body flange, surrounded by the outer body flange, contacts a side of the disk magnet opposite the sputtering target. One or more insulators positioned between the ring magnet and the disk magnet couple the inner body flange, the outer body flange, and the one or more cooling tubes together in an operative relation, and electrically isolate the inner body flange, the outer body flange, and the one or more cooling tubes from each other to form an ultra-high vacuum seal without the use of one or more elastomer seals.

12 Claims, 3 Drawing Sheets

HERMETICALLY SEALED MAGNETIC KEEPER CATHODE

CROSS REFERENCE TO RELATED APPLICATION

This application claims benefit of U.S. Provisional Patent Application No. 62/172,302, filed Jun. 8, 2015, which is incorporated herein by reference in its entirety.

BACKGROUND OF THE INVENTION

Field of Invention

The present invention relates to a sputtering cathode and, more particularly, to a sputtering cathode with a magnetic keeper that is hermetically sealed.

Description of Related Art

Prior art sputtering cathodes utilize thermally conductive material to conduct heat to a cooling fluid.

It would be desirable to provide a sputtering cathode that avoided the use of thermally conductive material to conduct heat to a cooling fluid while simultaneously facilitating effective fluid cooling of the target of the sputtering cathode. It would also be desirable that the fluid cooled sputtering cathode be hermetically sealed so that it can be used at ultra-high vacuum levels.

SUMMARY

Various preferred and non-limiting examples or aspects of the present invention will now be described and set forth in the following numbered clauses.

Clause 1: A sputtering cathode comprising: a magnet array including an outer, ring magnet surrounding an inner, disk magnet; a sputtering target on one side of the magnet array covering a side of the ring magnet and a side of the disk magnet; a magnetic keeper disk between the sputtering target and the disk magnet; a cooling well between the ring magnet and the disk magnet, wherein the cooling well is in contact with the sputtering target; one or more cooling tubes coupled to the cooling well; an outer body flange surrounding the one or more cooling tubes and contacting a side of the ring magnet opposite the sputtering target; an inner body flange contacting a side of the disk magnet opposite the sputtering target; and one or more insulators positioned between the ring magnet and the disk magnet, the one or more insulators coupling the inner body flange, the outer body flange, and the one or more cooling tubes together in an operative relation, and electrically isolating the inner body flange, the outer body flange, and the one or more cooling tubes from each other without the use of one or more elastomer seals.

Clause 2: The sputtering cathode of clause 1, wherein each insulator is coupled to each of the inner body flange, the outer body flange, and at least one of the cooling tubes via brazing.

Clause 3: The sputtering cathode of clause 1 or 2, wherein the cooling well is between the one or more insulators and the sputtering target.

Clause 4: The sputtering cathode of any of clauses 1-3, wherein the magnetic keeper disk is in contact with the sputtering target and is spaced from the disk magnet.

Clause 5: The sputtering cathode of any of clauses 1-4, wherein the one or more cooling tubes are coupled to the cooling well via the one or more insulators.

Clause 6: The sputtering cathode of any of clauses 1-5, wherein the ring magnet, the disk magnet, the sputtering target, and the magnetic keeper disk are arranged coaxially.

Clause 7: The sputtering cathode of any of clauses 1-6, wherein the inner body flange, the outer body flange, and the cooling well are arranged coaxially.

Clause 8: The sputtering cathode of any of clauses 1-7, wherein the sputtering target is spaced from the ring magnet.

Clause 9: The sputtering cathode of any of clauses 1-8, further including an insulating seal on a side of the inner body flange opposite the inner disk magnet, the insulating seal coupled without the use of one or more elastomer seals between the outer body flange and the one or more cooling tubes.

Clause 10: The sputtering cathode of any of clauses 1-9, wherein the insulating seal is coupled via brazing to the one or more cooling tubes.

Clause 11: The sputtering cathode of any of clauses 1-10, further including a sleeve between the insulating seal and the outer body flange.

Clause 12: The sputtering cathode of any of clauses 1-11, wherein the sleeve is brazed to the insulating seal.

Clause 13: The sputtering cathode of any of clauses 1-12, wherein: at least a portion of a rear housing is positioned between the sleeve and the outer body flange; and a metal gasket is positioned between the portion of a rear housing and the outer body flange.

DETAILED DESCRIPTION

With reference to the accompanying figures, disclosed herein is a sputtering cathode C that utilizes a target T to which is attached a magnetic keeper 1. Magnetic keeper 1 is configured to couple with the underlying cathode's magnetic field and provide a force that holds target T in place on the face of the sputtering cathode C.

In contrast to existing designs that utilize targets with attached magnetic keepers, the sputtering cathode C described herein does not utilize a thermally conductive material (such as aluminum nitride) to conduct heat to a cooling fluid. Instead, hermetic ceramic-to-metal seals provide electrical isolation between a cooling well 4 and cathode body flanges 6 and 6', allowing direct contact of the target T to cooling well 4.

Utilizing a fully hermetically sealed design as such allows for comparatively high power density when referenced to existing sputtering cathode designs. Furthermore, the hermetic ceramic-to-metal seals preclude the need for elastomer seals to create vacuum environment in the interior of sputtering cathode C. This enables sputtering cathode C to be used in applications requiring ultra-high vacuum (UHV) levels, e.g. $\leq 10^{-5}$ Torr (0.133 mPa), or $\leq 10^{-6}$ Torr (0.0133 mPa).

Figure 1:
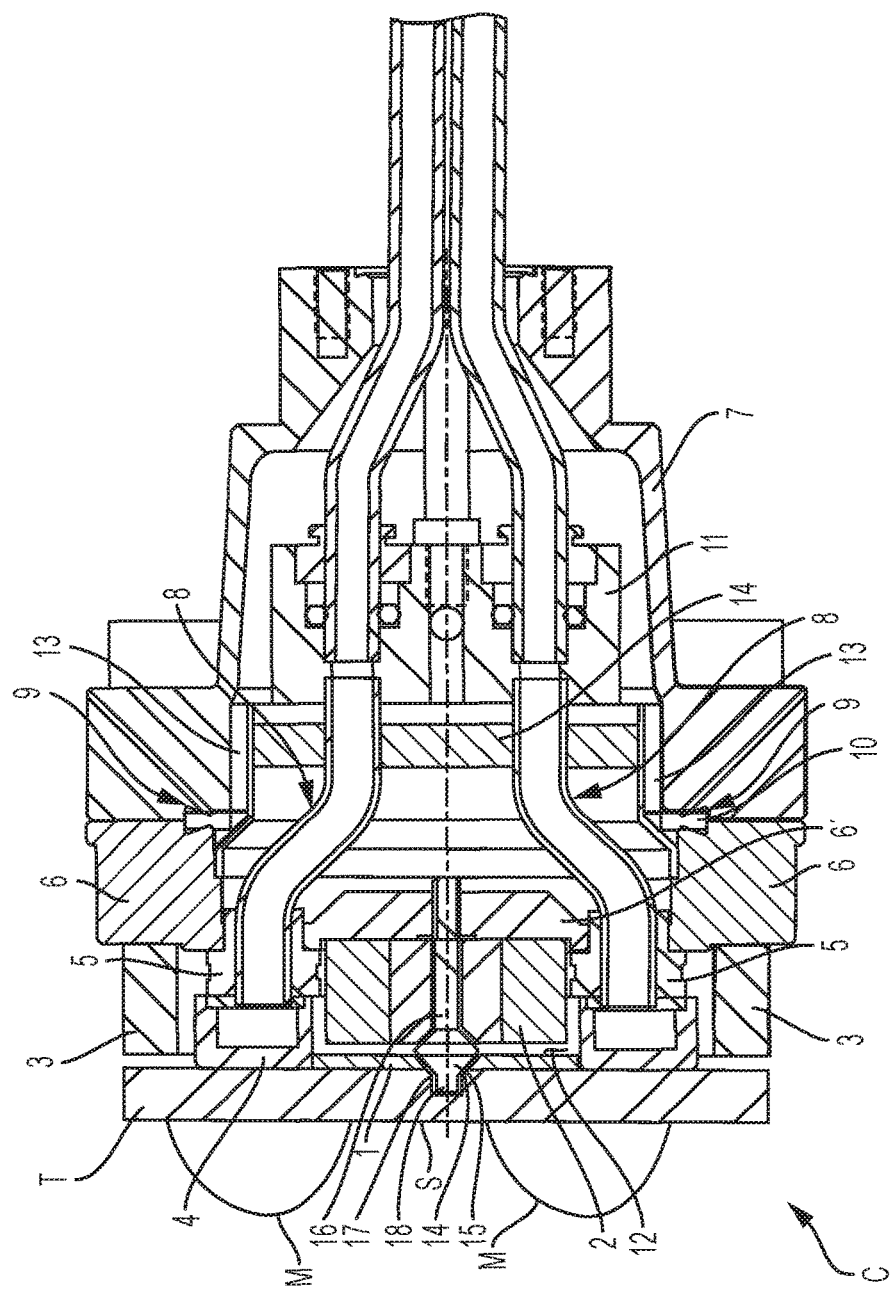
FIG. 1 is a schematic cross-section of an example sputtering cathode.
Figure 2:
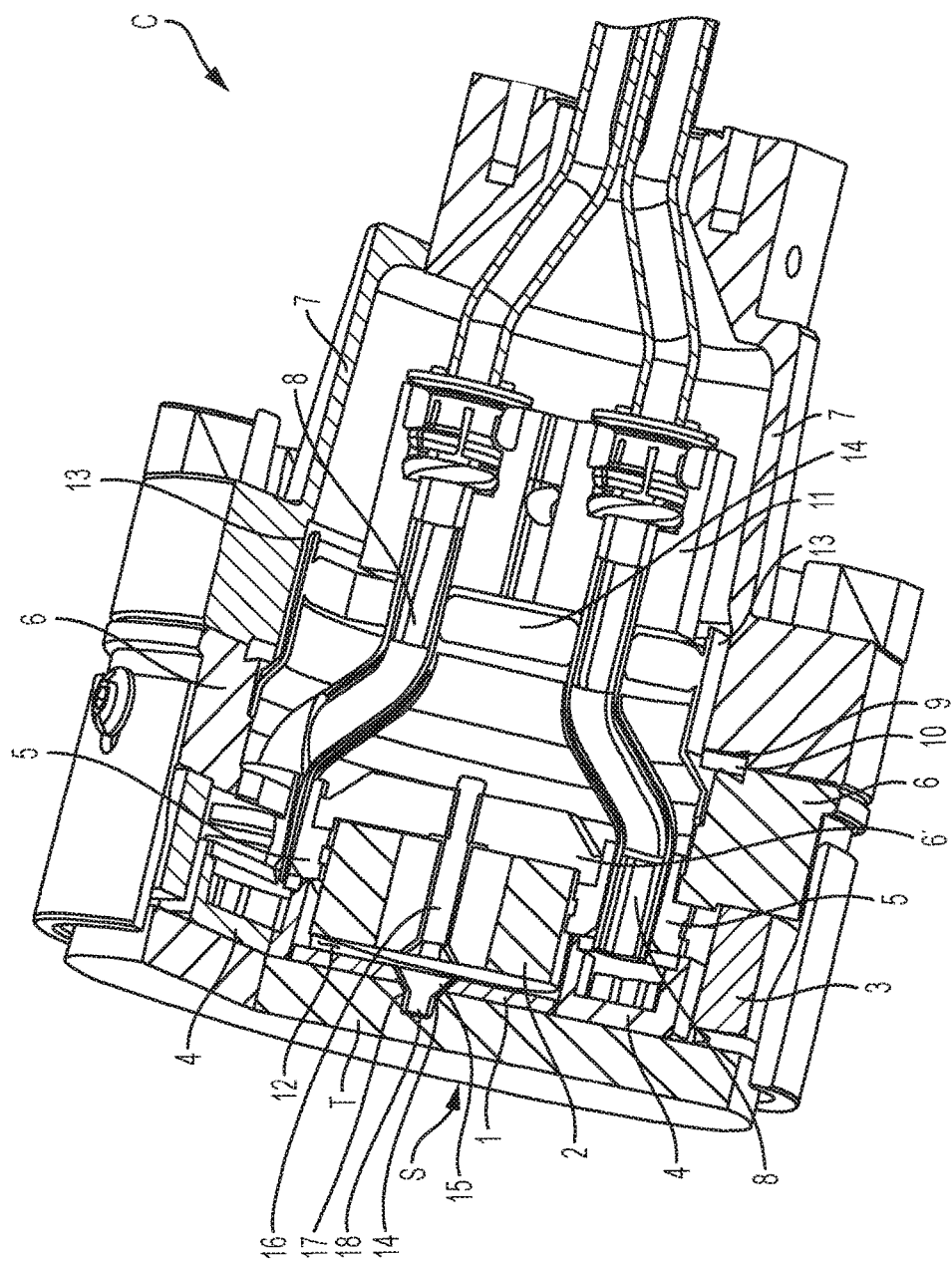
FIG. 2 a solid cross-section of the example sputtering cathode of FIG. 1.

Referring now to FIGS. 1 and 2, a magnetic keeper disk 1 (made from magnetically susceptible material) is attached to one side, e.g., a back side, of a sputtering target T, e.g., round planar sputtering target, that may or may not be magnetically susceptible—depending on the material(s) used to form sputtering target T to be sputtered.

Below (to the right in FIGS. 1 and 2) sputtering target T is a magnetic array comprised of an inner disk magnet 2 and outer ring magnet 3 that creates a toroidal magnetic field M above the surface S of sputtering target T.

Magnetic keeper disk 1 couples to the magnetic field M produced by magnet array 2, 3 to provide a force that holds target T in place. In an example, magnetic keeper disk 1 can include a central conical hole 14 configured to receive a tapered end 15 of a center post 16 of sputtering cathode C in a countersink arrangement. In an example, target T can include a central aperture 17 and a distal end of center post 16 can include a projection 18 configured to mate with aperture 17. The combination of conical hole 14 and aperture 17 facilitates the quick and accurate placement of magnetic keeper disk 1 and target T on tapered end 15 and projection 18 of center post 17 and mounting of target T in use of sputtering cathode C.

Via the coupling force between magnetic keeper disk 1 and the magnet array 2, 3, target T is held in direct contact with an annular cooling well 4 without the use of thermally conductive material between target T and cooling well 4. Cooling tubes 8, coupled to annular cooling well 4, are utilized to supply cooling fluid to and to remove cooling fluid from cooling well 4. In an example, cooling well 4 and cooling tubes 8 are made from copper.

One or more insulators 5, in an example, made of ceramic, electrically isolate cooling tubes 8 and cooling well 4 from an outer body flange 6 and an inner body flange 6'. In an example, body flanges 6, 6' can be made from magnetic stainless steel, e.g., 410 stainless steel, and can be configured to support outer ring magnet 3 and inner disk magnet 2, respectively. The connection between the one or more insulators 5 and each of: (1) cooling tubes 8, (2) outer body flange 6 and (3) inner body flange 6' can be via brazing, i.e., without the use of one or more elastomeric seals. Brazing insulator(s) 5 to (1) cooling tubes 8, (2) outer body flange 6 and (3) inner body flange 6' enables the formation of UHV compatible junctions between these elements. In an example, outer body flange 6 and an inner body flange 6' can be part of the same element. However, this is not to be construed in a limiting sense.

Inner body flange 6' supports inner magnet 2 in spaced relation to target T and magnetic keeper disk 1, via a gap 12 therebetween. Outer ring magnet 3 is also spaced from target T via a gap (seen in FIG. 1). When coupled together, the rear of outer body flange 6 and the front of a rear housing 7 define an annular channel 9 configured to receive an annular metal, e.g., copper, gasket 10 to create a UHV compatible junction. Opposing sides of channel 9 include annular knife edges formed in the rear of outer body flange 6 and the front of rear housing 7 that engage and hold metal gasket 10 in place in channel 9. This UHV compatible junction facilitates the provisioning of electrical power to target T and water to cooling well 4 via cooling tubes 8 via an inner diameter of a mounting tube 11.

In summary, the sputtering cathode in FIGS. 1 and 2 utilizes a magnet array 2, 3 to generate a toroidal magnetic field M above the surface S of sputtering target T. To target T is attached a magnetic keeper 1 that couples with the magnetic field produced by magnets 2, 3 to provide a holding force that keeps target T in contact with cooling well 4. The one or more insulators 5 electrically isolate target T and cooling well 4 from body flanges 6, 6' and rear housing 7. In contrast to current sputtering cathodes, the sputtering cathode of FIGS. 1 and 2 avoids the use of thermally conductive material between target T and the cooling well 4 and avoids the use of elastomer O-rings, for example, between insulator(s) 5 and body flange 6, between insulator(s) 5 and body flange 6', and between insulator(s) 5 and cooling tubes 8, to create a UHV seal, enabling its use in UHV systems.

An insulating seal 14 is affixed to body flange 6 via an outer sleeve 13. In an example, insulating seal 14 can be made from ceramic which is affixed, e.g., via brazing, to both outer sleeve 13 and cooling tubes 8. A portion of rear housing 7 by metal gasket 10 surrounds and supports outer sleeve 13 and insulating seal 14 in position. Cooling tubes 8 terminate in annular cooling well 4 which, in an example, is adjacent to and in direct contact with a back side of target T. Cooling tubes 8 are electrically insulated via insulators 5 from body flanges 6, 6'.

Figure 3:
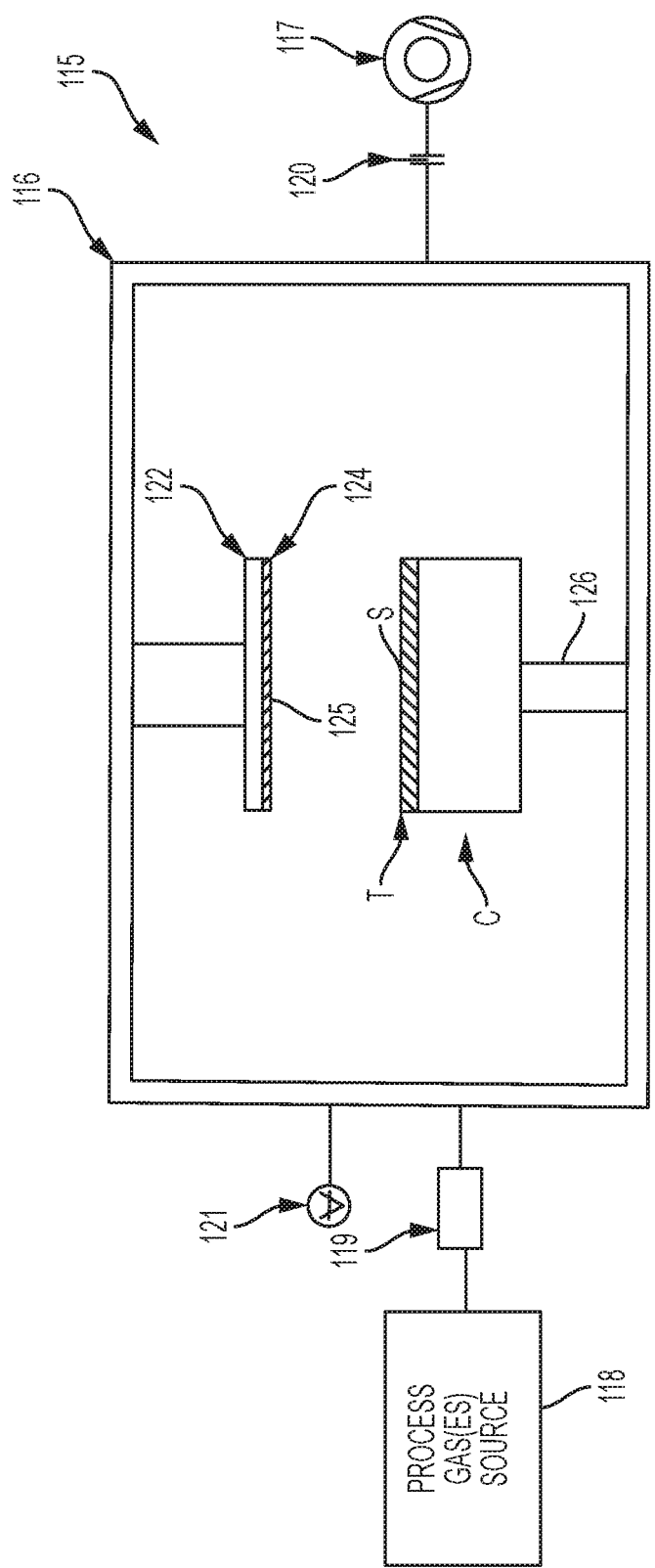
FIG. 3 is a schematic of the example sputtering cathode of FIGS. 1 and 2 in a physical vapor deposition system.

With reference to FIG. 3 and with continuing reference to FIGS. 1 and 2, in an example, cathode C can be used for sputtering in a Physical Vapor Deposition (PVD) system 115. In an example, PVD system 115 includes a vacuum enclosure 116 which is sealed from ambient atmosphere to allow air to be evacuated from enclosure 116 via a pumping system 117. Once evacuated to a suitable pressure for PVD, enclosure 116 is backfilled from a process gas(es) source 118 with an application-appropriate (inert or reactive) gas at a pressure to allow plasma P generation in a manner known in the art, e.g., via coupling of DC or RF electrical power to enclosure 116 from a suitable power source 130. Backfill gas flow is controlled via a mass flow controller 119. In an example, adequate pressure inside of enclosure 116 is maintained by controlling a gate or throttling valve 120 coupled to pumping system 117 via a signal output from a vacuum gauge 121.

The hermetically sealed cathode C is mounted inside vacuum enclosure 116 to sputter material from a surface S of target T in a manner known in the art of sputtering. FIG. 3 illustrates cathode C mounted to the bottom of enclosure 116 with a substrate 124 disposed above cathode C inside enclosure 116 to receive a sputter coating of material from target T of cathode C. However, it is envisioned that the positions of cathode C and substrate 124 can be reversed in FIG. 3.

Material sputtered from the surface S of target T condenses/adheres on a surface or face 125 of substrate 124 that faces target T. In an example, substrate 124 can be mounted to a device 122 that enables substrate 124 to be moved relative to the surface S of cathode C for improved uniformity or continuous coating applications. In an example, cathode C can also or alternatively be mounted to a device 126 that enables cathode C to be moved relative to face 125 of substrate 124. The movement of substrate 124 via device 122 and/or the movement of cathode C via device 126 can be linear, rotary, or some combination linear and rotary.

One advantage of cathode C includes cooling well 4 in contact with the backside of target T facilitate in more efficient cooling of target T during a sputtering event compared to prior art sputtering cathodes, which allows higher power to target T and thus, higher effective sputtering rates. Another advantage of cathode C is the absence of elastomer seals, thereby allowing cathode C and, hence, PVD system 15 to operate at lower vacuum pressures than a PVD system can utilizing prior art sputtering cathodes.

The example has been described with reference to the accompanying Figs. Modifications and alterations will occur to others upon reading and understanding the foregoing examples. Accordingly, the foregoing examples are not to be construed as limiting the disclosure.

The invention claimed is:

1. A sputtering cathode comprising:
   a magnet array including an outer, ring magnet surrounding an inner, disk magnet;
   a sputtering target on one side of the magnet array covering a side of the ring magnet and a side of the disk magnet;
   a magnetic keeper disk between the sputtering target and the disk magnet, the magnetic keeper disk in contact with the sputtering target and spaced from the disk magnet by a gap;
   a cooling well between the ring magnet and the disk magnet, wherein the cooling well is in direct contact with the sputtering target;
   one or more cooling tubes coupled to the cooling well;
   an outer body flange surrounding the one or more cooling tubes and contacting a side of the ring magnet opposite the sputtering target;
   an inner body flange contacting a side of the disk magnet opposite the sputtering target; and
   one or more insulators positioned between the ring magnet and the disk magnet, the one or more insulators coupling the inner body flange, the outer body flange, and the one or more cooling tubes together in an operative relation, and electrically isolating the inner body flange, the outer body flange, and the one or more cooling tubes from each other without the use of one or more elastomer seals.

2. The sputtering cathode of claim 1, wherein each insulator is coupled to each of the inner body flange, the outer body flange, and at least one of the cooling tubes via brazing.

3. The sputtering cathode of claim 1, wherein the cooling well is between the one or more insulators and the sputtering target.

4. The sputtering cathode of claim 1, wherein the one or more cooling tubes are coupled to the cooling well via the one or more insulators.

5. The sputtering cathode of claim 1, wherein the ring magnet, the disk magnet, the sputtering target, and the magnetic keeper disk are arranged coaxially.

6. The sputtering cathode of claim 1, wherein the inner body flange, the outer body flange, and the cooling well are arranged coaxially.

7. The sputtering cathode of claim 1, wherein the sputtering target is spaced from the ring magnet.

8. The sputtering cathode of claim 1, further including an insulating seal on a side of the inner body flange opposite the inner disk magnet, the insulating seal coupled without the use of one or more elastomer seals between the outer body flange and the one or more cooling tubes.

9. The sputtering cathode of claim 8, wherein the insulating seal is coupled via brazing to the one or more cooling tubes.

10. The sputtering cathode of claim 8, further including a sleeve between the insulating seal and the outer body flange.

11. The sputtering cathode of claim 10, wherein the sleeve is brazed to the insulating seal.

12. The sputtering cathode of claim 11, wherein:
    at least a portion of a rear housing is positioned between the sleeve and the outer body flange; and
    a metal gasket is positioned between the portion of a rear housing and the outer body flange.

* * * * *